(12) United States Patent
Bonges, III et al.

(10) Patent No.: US 7,275,226 B2
(45) Date of Patent: Sep. 25, 2007

(54) METHOD OF PERFORMING LATCH UP CHECK ON AN INTEGRATED CIRCUIT DESIGN

(75) Inventors: Henry A. Bonges, III, Milton, VT (US); David C. Reynolds, Essex Junction, VT (US); James E. Sundquist, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 10/709,205

(22) Filed: Apr. 21, 2004

(65) Prior Publication Data

US 2005/0240886 A1 Oct. 27, 2005

(51) Int. Cl.
G06F 9/45 (2006.01)
G03F 1/00 (2006.01)
G03F 9/00 (2006.01)
G03C 5/00 (2006.01)

(52) U.S. Cl. ............... 716/5; 716/4; 716/8; 716/18; 716/19; 716/20; 430/5; 430/22; 430/30

(58) Field of Classification Search ............. 716/2–5, 716/11, 14, 18, 19, 21; 714/48; 703/5; 348/241, 348/247; 326/41; 257/66, 141; 250/370.09
See application file for complete search history.

(56) References Cited

U.S. PATENT DOCUMENTS

| | | | |
|---|---|---|---|
| 5,734,388 A * | 3/1998 | Ristow et al. ............. 345/472 |
| 6,263,299 B1 * | 7/2001 | Aleshin et al. ............... 703/5 |
| 6,282,696 B1 * | 8/2001 | Garza et al. ................. 716/19 |
| 6,317,859 B1 * | 11/2001 | Papadopoulou ............... 716/4 |
| 6,324,673 B1 * | 11/2001 | Luo et al. .................... 716/11 |
| 6,493,858 B2 * | 12/2002 | Solomon .................... 716/11 |
| 6,535,247 B1 * | 3/2003 | Kozlowski et al. ......... 348/241 |
| 6,557,162 B1 * | 4/2003 | Pierrat ........................ 716/21 |
| 6,560,766 B2 * | 5/2003 | Pierrat et al. ................ 716/19 |
| 6,615,393 B1 * | 9/2003 | Bell .............................. 716/5 |
| 6,629,292 B1 * | 9/2003 | Corson et al. ................ 716/3 |
| 6,728,399 B1 * | 4/2004 | Doll .......................... 382/164 |
| 6,769,102 B2 * | 7/2004 | Frank et al. ................... 716/5 |
| 6,845,034 B2 * | 1/2005 | Bhattacharyya ............ 365/149 |

(Continued)

OTHER PUBLICATIONS

Bhat et al., "Special Purpose Architecture for Accelerating Bitmap DRC", Jun. 25-29, 1989, Design Automation, 26th Conference on, pp. 674-677☐☐.*

(Continued)

*Primary Examiner*—Thuan Do
*Assistant Examiner*—Helen Rossoshek
(74) *Attorney, Agent, or Firm*—Howard M. Cohn, Esq.; H. Daniel Schnurmann

(57) ABSTRACT

A method of performing latch up check on an integrated circuit (IC) design that comprises rasterizing a conductor region shape and contact shapes and iteratively expanding the contact shapes within the conductor region shape using a cellular algorithm. Direction values for contact cells can be used to limit the number of neighboring cells which must be explored. In every fourth iteration of the expansion process, corner cells may not be expanded. Reachable areas outside of conductors can also be explored.

19 Claims, 9 Drawing Sheets

U.S. PATENT DOCUMENTS

| | | | |
|---|---|---|---|
| 6,856,030 B2* | 2/2005 | Madurawe | 257/141 |
| 6,901,574 B2* | 5/2005 | LaCour et al. | 716/19 |
| 6,917,041 B2* | 7/2005 | Doty et al. | 250/370.09 |
| 6,917,380 B1* | 7/2005 | Tay | 348/247 |
| 6,931,617 B2* | 8/2005 | Sanie et al. | 716/18 |
| 6,996,797 B1* | 2/2006 | Liebmann et al. | 716/19 |
| 6,998,722 B2* | 2/2006 | Madurawe | 257/66 |
| 7,017,141 B2* | 3/2006 | Anderson et al. | 716/19 |
| 7,030,651 B2* | 4/2006 | Madurawe | 326/41 |
| 2003/0023939 A1* | 1/2003 | Pierrat et al. | 716/3 |
| 2004/0078724 A1* | 4/2004 | Keller et al. | 714/48 |
| 2004/0210856 A1* | 10/2004 | Sanie et al. | 716/2 |
| 2005/0076316 A1* | 4/2005 | Pierrat et al. | 716/4 |
| 2005/0216877 A1* | 9/2005 | Pack et al. | 716/19 |
| 2005/0273748 A1* | 12/2005 | Hetzel et al. | 716/14 |

OTHER PUBLICATIONS

Rutenbar et al., "A Class of Cellular Architectures to Support Physical Design Automation", Oct. 1984, Computer-Aided Design of Integrated Circuits and Systems, IEEE Transactions on, vol. 3, Issue 4, pp. 264-278.*

Eustace et al., "A Deterministic Finite Automaton Approach to Design Rule Checking for VLSI", Jun. 14-16, 1982, Design Automation, 19th Conference on, pp. 712-717.*

Schaffer et al., "Requirements and constraints for the design of smart photodetector arrays for page-oriented optical memories",Sep.-Oct. 1998, Selected Topics in Quantum Electronics, IEEE Journal of, vol. 4,Issue 5,pp. 856-865.*

Seiler, "A Hardware Assisted Design Rule Check Architecture", Jun. 14-16, 1982, Design Automation, 19th Conference on pp. 232-238.*

* cited by examiner

| B | B | B | B | B | B | B | B | B | B | B | B | B | B | B | B | B | B | B | B | B | B | B | B | B | B |
|---|---|---|---|---|---|---|---|---|---|---|---|---|---|---|---|---|---|---|---|---|---|---|---|---|---|
| B |   |   |   |   |   |   |   |   |   |   |   |   |   |   |   |   |   |   |   |   |   |   |   |   | B |
| B |   | N | N | N | N | N | N | N | N |   |   |   |   |   |   | N | N | N | N | N | N | N | N |   | B |
| B |   | N | x | x | x | x | x | x | N |   |   |   |   |   |   | N |   |   |   |   |   |   | N |   | B |
| B |   | N | x | x | x | x | x | x | N |   |   |   |   |   |   | N |   |   |   |   |   |   | N |   | B |
| B |   | N | x | x | x | x | x | x | N |   |   |   |   |   |   | N | x | x | x | x | x | x | N |   | B |
| B |   | N | x | x | x | x | x | x | N |   |   |   |   |   |   | N | x | x | x | x | x | x | N |   | B |
| B |   | N | x | x | x | x | x | x | N |   |   |   |   |   |   | N | x | x | x | x | x | x | N |   | B |
| B |   | N | x | x | x | x | x | x | N | N | N | N | N | N | N | N | x | x | x | x | x | x | N |   | B |
| B |   | N | x | x | C | x | x | x | x | x | x |   |   |   | x | x | x | x | x | x | x | x | N |   | B |
| B |   | N | x | x | C | x | x | x | x | x | x |   |   |   | x | x | x | x | x | x | x | x | N |   | B |
| B |   | N | x | x | C | x | x | x | x | x | x |   |   |   | x | x | x | x | x | x | C | x | x | N | B |
| B |   | N | x | x | x | x | x | x | x | x | x |   |   |   | x | x | x | x | x | x | x | x | N |   | B |
| B |   | N | N | N | N | N | N | N | N | N | N | N | N | N | N | N | N | N | N | N | N | N | N |   | B |
| B |   |   |   |   |   |   |   |   |   |   |   |   |   |   |   |   |   |   |   |   |   |   |   |   | B |
| B | B | B | B | B | B | B | B | B | B | B | B | B | B | B | B | B | B | B | B | B | B | B | B | B | B |

| B | B | B | B | B | B | B | B | B | B | B | B | B | B | B | B | B | B | B | B | B | B | B | B | B | B |
|---|---|---|---|---|---|---|---|---|---|---|---|---|---|---|---|---|---|---|---|---|---|---|---|---|---|
| B |   |   |   |   |   |   |   |   |   |   |   |   |   |   |   |   |   |   |   |   |   |   |   |   | B |
| B |   | N | N | N | N | N | N | N | N |   |   |   |   |   |   | N | N | N | N | N | N | N | N |   | B |
| B |   | N | x | x | x | x | x | x | N |   |   |   |   |   |   | N | o | o | o | o | o | o | N |   | B |
| B |   | N | x | x | x | x | x | x | N |   |   |   |   |   |   | N | o | o | o | o | o | o | N |   | B |
| B |   | N | x | x | x | x | x | x | N |   |   |   |   |   |   | N | x | x | x | x | x | x | N |   | B |
| B |   | N | x | x | x | x | x | x | N |   |   |   |   |   |   | N | x | x | x | x | x | x | N |   | B |
| B |   | N | x | x | x | x | x | x | N |   |   |   |   |   |   | N | x | x | x | x | x | x | N |   | B |
| B |   | N | x | x | x | x | x | x | N | N | N | N | N | N | N | N | x | x | x | x | x | x | N |   | B |
| B |   | N | x | x | C | x | x | x | x | x | o | o | o | o | o | x | x | x | x | x | x | x | x | N | B |
| B |   | N | x | x | C | x | x | x | x | x | o | o | o | o | o | x | x | x | x | x | x | x | x | N | B |
| B |   | N | x | x | C | x | x | x | x | x | o | o | o | o | o | x | x | x | x | x | x | C | x | x | N |
| B |   | N | x | x | x | x | x | x | x | x | o | o | o | o | o | x | x | x | x | x | x | x | x | N | B |
| B |   | N | N | N | N | N | N | N | N | N | N | N | N | N | N | N | N | N | N | N | N | N | N |   | B |
| B |   |   |   |   |   |   |   |   |   |   |   |   |   |   |   |   |   |   |   |   |   |   |   |   | B |
| B | B | B | B | B | B | B | B | B | B | B | B | B | B | B | B | B | B | B | B | B | B | B | B | B | B |

FIG. 21

METHOD OF PERFORMING LATCH UP CHECK ON AN INTEGRATED CIRCUIT DESIGN

BACKGROUND OF INVENTION

The invention relates to the design of semiconductor devices and checking that the designs meet certain criteria (ground rules).

Field effect transistors (FETs) are fabricated using Complementary Metal-Oxide Semiconductor (CMOS) techniques. Most commercial silicon semiconductor processes create transistors by the implantation of dopants into a bulk silicon wafer. For example, in an "N-Well" process, the N-FETs are formed in the bulk material (or in a twin P-well in the P-substrate) and the P-FETs transistors are formed in an "N-Well" which is implanted into the substrate. An N-Well is an example of what will be referred to herein as a "conductor region".

A problem inherent in the fabrication of CMOS transistors is "latch up", also known as the "thyristor effect". Generally, adjacent P-FETs and N-FETs create lateral, parasitic, bipolar structures (e.g., thyristors, SCRs, transistors) which, under certain conditions, can produce functional failure due to excessive drain current. One way by which the latch up can be avoided is by providing N-well and P-well contacts (also known as "well contacts", "substrate ties", "substrate contacts" and "butting contacts") in close proximity to all active elements (junctions) of the FETs to keep leakage currents small.

Design Rule Checking (DRC) is performed on an integrated circuit (IC) chip design to ensure that the design meets various criteria (ground rules). For example, a latch up check can be performed to determine whether a design meets the criteria of having well contacts in close proximity (e.g., within 20 µm) to the active elements (i.e., the FET junctions).

FIG. 1 is a block diagram illustrating a simplified exemplary architecture of an IC design system 100 within which the present invention can be embodied. Design information is stored in a hardware (H/W) description/representation file 102 and can be read by a design representation reader 104 capable of processing the design information. Design rules may be included in a control file associated with the hardware design representation 102, such as a control file 106. The system 100 also includes a control file reader 108. The system 100 includes a model builder 110, a design analyzer 112, a property manager 114, an analysis engine 116, and a report manager 118. The model builder 110 receives output of the hardware design representation reader and the control file reader 108 and builds an internal representation of the hardware design, i.e., a model. The design analyzer 112 automatically produces a comprehensive set of attributes such as design verification checks based upon a predetermined set of properties. The property manager 114 maintains information regarding relationships among the checks generated by the design analyzer 112 and additionally maintains information regarding relationships among properties and whether the properties are satisfied, violated, or whether the results are indeterminate or conditional upon one or more other properties. The property manger 114 and the analysis engine 116 may cooperate to determine dependency relationships among a comprehensive set of design verification checks. The analysis engine 116 verifies the model produced by the model builder 110 by testing for violations of the properties. The analysis engine 116 may employ an analysis-based technique, such as an integration of simulation and formal analysis methodologies, so as to maximize stimulus coverage for the design under test. Alternatively, simulation, functional verification, or other well-known verification methodologies may be employed individually. The report manager 118 provides feedback to the designer, in the form of a report file 120, for example, regarding potential design defects. Results are maintained in a results database 122. Conventional Input/Output (I/O) devices have been omitted, for illustrative clarity.

Semiconductor devices are designed using tools (e.g., layout editor) which generate geometric patterns (shapes) representing the various elements of the semiconductor device for example, the conductive regions and well contacts discussed above. The shapes generated by the layout editor are typically generated as "vector images" using a vector graphics program. A layout tool may be embodied in the design system 100.

Vector images comprise mathematically-defined geometric shapes (scalable objects)—lines, curves, shapes, objects and fills. These scalable objects are defined by mathematical equations. Since vectors entail both magnitude and direction, vector elements are thus comprised of line segments whose length represents magnitude and whose orientation in space represents direction. Vector graphic images are readily scaled. In contrast with vector images, "raster images" (also known as "bitmap images") comprise a plurality of picture elements (pixels) which are typically arranged in a grid, such as an array of rows and columns. As relevant to the present invention, each cell of a raster image array can be filled with a byte (digital value).

FIGS. 2A and 2B illustrate a generalized situation wherein latch up may occur, as described hereinabove. An exemplary conductor region 202 (such as an N-well) is shown. The conductor region 202 can be any arbitrary shaped polygon, and can contain several active devices and any number of contacts, such as well 204. The well contact 204 is disposed within the conductor region 202. In this example, the conductor region 202 is a U-shaped polygon having two "legs", a left-hand (as viewed) leg and a right-hand (as viewed) leg. In this example, the well contact 204 has a square shape and is disposed near the end of the left-hand leg of the U-shaped conductor region 202.

The U-shaped conductor region 202 is termed a "non-convex" polygon. A polygon is defined to be "convex" if for any two points that lie within the polygon, a line segment connecting them is also inside the polygon. A regular octagon (e.g., shape of a traffic stop sign) is an example of a convex polygon. For simplicity, a "concave" polygon is defined as any polygon which is not "convex". The U-shaped conductor region 202 is a concave polygon. It is not a convex polygon.

A distance "I" is defined as the minimum required separation of the outside edges of the conductor shape, and is illustrated as the size of a gap between the two legs of the U-shaped polygon in the conductor region. This distance "I" is also used as an expansion increment, as discussed below, and is generally the largest expansion increment that will work, although it may be advantageous to choose a smaller value (for expansion) in some circumstances.

The location of the well contact 204 within the conductor region 202, and the overall size of the conductor region 202 are important, for the following reason. Any part of the conductor region 202 which is farther than a distance "D" from the well contact 204 is defined as "unreachable". This is illustrated by the arrow 206. In this example, a portion 208 (shown cross hatched in FIG. 2A) of the conductor region 202 is unreachable (by the contact 204)—namely, an upper end portion of the right-hand leg of the U-shaped conductor region 202. By definition, the remaining portion 210 of the conductor region 202 is "reachable". In this example, the reachable portion (area) 210 of the conductor region 202 comprises the left-hand leg (including the contact area) and the bottom of the U-shaped conductor region 202, as well as a lower portion of the right-hand leg of the U-shaped conductor region 202.

FIG. 2B also shows three junctions 212, 214, 216 superimposed on the conductor region 202. The junction 212 is within the reachable area 210, the junction 214 is partially within the reachable area 210 and partially within the unreachable area 208, and the junction 216 is entirely within the unreachable area 208. Any junctions touching the unreachable area 208 are defined as "erroneous", and corrective measures are required (e.g., to avoid latch up). In this example, the junctions 214 and 216 are erroneous. The junction 212 is not erroneous. The corrective measures may simply involve placing additional contacts within the conductor region. In layman's terms, any transistor junctions which are formed in conductive regions should be within a distance "D" of a well contact. Otherwise, problems may occur. This is all well known.

FIGS. 3-9 illustrate an exemplary situation wherein latch up may occur, as described hereinabove. Two well contacts 304 and 306 (compare 204) are disposed within a conductor region 302 (compare 202). As in the previous example, the conductor region 302 is a U-shaped polygon having two "legs", a left-hand (as viewed) leg and a right-hand (as viewed) leg, and is not convex.

The contact 304 has a rectangular shape and is disposed in a lower-left corner portion of the conductor region 302. The contact 306 has a square shape and is disposed in a lower-right corner portion of the conductor region 302. The contacts 304 and 306 are shown as being disposed inward from the perimeter of the conductor region 302, but they can also be disposed against the perimeter of the conductor region 302.

A traditional method of determining the reachable area (e.g., 210) of a conductor region (e.g., 202) involves iteratively expanding the contact shapes and intersecting them with the conductor region shape until the conductor region is completely filled, or until the distance limit ("D") has been reached. The method proceeds as follows.

First, the contact shapes 304 and 306 are expanded (enlarged) by the expansion increment (I). The expansion increment "I" is defined as the minimum required separation of the outside edges of the conductor region shape. As mentioned above, the distance "I" is defined as the minimum required separation of the outside edges of the conductor shape, and is illustrated as the size of a gap between the two legs of the U-shaped polygon of the conductor region. This distance "I" is also used as an expansion increment, and is generally the largest expansion increment that will work, although it may be advantageous to choose a smaller value (for expansion) in some circumstances. The increment "I" is, by definition, less than "D", and "D" can be defined as a multiple of "I" (D=n*I). (There may be a remainder to D/I, i.e. D=n*I+R) For example, "I"=approximately 1 μm and "D"=approximately 50-100 μm. The expanded contact shapes (new contact areas) are shown as 404 and 406, respectively, in FIG. 4. (Getting a little ahead of ourselves, and as described below, by expanding the contact shapes up to "n" times, the expanded contact shapes will represent the reachable area of the conductor region.) The contact shapes 304 and 306 are vector graphic images, and are readily scaled (expanded) simply by specifying a larger size for the image.

As is evident in FIG. 4, portions of the expanded contact shapes 404 and 406 can extend to outside of the conductor region 302. Therefore, any portion of the new contact area 404 and 406 which falls outside the conductor region shape 302 is trimmed (cropped, deleted). The cropped contact shapes 504 and 506 are shown in FIG. 5. Their outer edges are coincident with the outer edges of the conductor shape 302.

This cropping step is important because: (i) the conductor region shape 302 is non-convex; and therefore, (ii) a contact shape (e.g., 304) that is being expanded could (in a few or several expansion steps) expand to outside of the conductor region shape could re-enter the conductor shape. (For example, a contact could expand outside of one leg of the U-shaped conductor region and then, in a next expansion step, enter the other leg of the U-shaped conductor region in an area which is not reachable via the conductor region.)

A check is performed to see if the new (expanded) contact shapes (504, 506) completely fill the conductor region shape. If so, stop—the entire conductor region 302 is reachable. In other words, if the contact shapes have been expanded less than n times, and the expanded contact shapes fill the conductor area, the entire conductor region is reachable. Otherwise, as in this example where the first expansion did not fill the entire conductor region, the expanded contact areas 504 and 506 are expanded again, by increment "I", and cropped (if necessary, as in this example). The resulting (twice expanded) contact shapes 604 and 606 are shown in FIG. 6.

The process of expanding and cropping continues, up to a maximum of "n" times (the maximum cumulative expansion amount), and at each expansion step there is a determination of whether the conductive region 302 has been filled.

If the maximum cumulative expansion amount has not been attained (fewer than n expansions have occurred), and the conductive shape 302 is filled, then the entire conductor region 304 is "reachable".

If the maximum cumulative expansion amount ("n" expansions) has been attained, and the conductive shape 302 is not filled, then part (a portion) of the conductive region is not reachable. Such a situation is shown in FIG. 7. The expanded contact shapes 704 and 706 do not completely fill the conductive shape 302. Rather, two areas 708 and 712 (shown cross hatched in FIG. 7, compare 208) of the conductive shape 302 are not reachable, and any junctions located in those non-reachable areas are considered to be "erroneous". In this case, the total area 708 and 712, representing the area of the conductive region shape 302 remaining after exhausting the maximum cumulative expansion amount, is readily computed by performing a geometric "difference" operation, i.e., subtracting the expanded contact shapes 704, 706 from the conductive region shape 302. As shown in FIG. 8, these remaining areas 708 and 712 (compare 208) are unreachable. The areas 810a and 810b (compare 210) are "reachable". The shapes 708 and 712 representing the unreachable areas of the conductor region 302 are then checked against junction shapes in the design and any junction shapes which intersect the unreachable areas are flagged as errors.

A typical distance for "D" is 50-100 μm. A typical distance for "I" is 1 μm. D=n*I (+R), wherein "n" is the number of expansions performed to explore reachability. Typically, a few tens (e.g., 20, 30) of expansions would be performed, sometimes over 100 may be required. For a long thin conductive region, only a few expansions may be required.

FIG. 9 (compare FIG. 2) shows three junctions 902, 904, 906 (compare 212, 214, 216) disposed in the left-hand leg of the conductor region 302, and three junctions 912, 914, 916 (compare 212, 214, 216) disposed in the right-hand leg of the conductor region 302. The junctions 902, 904, 906 are all within the reachable area 810a of the conductor region 302. The junction 912 is within the reachable area 810b of the conductor region 302. The junction 914 is partially within the unreachable area 712, and the junction 914 is entirely within the unreachable region 712.

Although this approach to the problem has the advantage of simplicity, it has two drawbacks: (i) poor performance due to a large number of complex operations; and (ii) lack of accuracy due to the application of rectilinear expansion operations, which cause corners to expand faster than sides. The corner expansion problem is illustrated in FIG. 10. There, it can be seen that when the sides of a contact 1004 (compare 204) expand by a distance "D", the corners expand by a distance equal to the square root of 2, or 1.41 times D—in other words, the corners expand 41% more than the sides. This can lead to erroneous results. This "corner error" could theoretically be mitigated by rounding the corners, but this would result in a major additional performance penalty, particularly when working with vector representations of shapes.

SUMMARY OF INVENTION

It is an aspect of the invention to provide an improved technique for performing design rule checking—namely, latch up check.

According to the invention, a method of performing latch up check on an integrated circuit (IC) design comprises the steps of: computing a combined least enclosing rectangle enclosing the conductor region shape and contact shapes; rasterizing a conductor region shape and contact shapes; iteratively expanding the contact shapes without the conductor region shape to determine reachable areas; generating shapes representing an unreachable area of the conductor region shape; checking the shapes representing the unreachable area of the conductor region shape against junction shapes in the design; and reporting to a designer any junction shapes which intersect the unreachable area as errors.

According to an embodiment of the invention, a method of performing latch up check on an integrated circuit (IC) design comprises the steps of: rasterizing a conductor region shape and contact shapes; and iteratively expanding the contact shapes within the conductor region shape using a cellular algorithm. Then, a least enclosing rectangle is computed which encloses the conductor region shape and the contact shapes. Further, a 2-dimensional byte array is created of sufficient size to rasterize the enclosing rectangle computed above at a resolution of "I", wherein the width and height of each cell in the array corresponds to the value "I". Each cell in the byte array is initialized to an empty code. The least enclosing rectangle is converted to raster format in the byte array. The conductor region shape is converted to raster format in the byte array. The contact shapes are converted to raster format in the byte array. The contact shapes are then expanded, up to "n" times into neighboring cells, if they are empty, using a cellular algorithm. Any cells which are not filled after these expansions are deemed unreachable. Junction shapes are superimposed to see if any junctions have been designed in unreachable areas of the contact region. Variations include: periodically skipping expanding corner cells of the contact shapes; and restricting the number of directions in which a cell can expand. Areas outside of the conductor region can also be explored by expanding contacts which are outside the conductor region.

BRIEF DESCRIPTION OF DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

FIGS. 11-20 are diagrams of a technique for performing latch up check, according to the present invention.

FIG. 21 is a diagram of a technique for performing latch up check, according to the present invention.

DETAILED DESCRIPTION

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting functions, and sometimes their relative sizes that is of significance.

The invention relates to the design of semiconductor devices and verifying that the designs meet certain criteria (ground rules), particularly reachability, to avoid latch up problems.

The general idea of the invention is to solve the reachability problem using a variation on what is known as a "cellular algorithm". Generally, the relevant shapes (conductor region and well contacts) are "rasterized" into an internal buffer (at low resolution), and the contact shapes are iteratively expanded within the conductor region shape by performing what is essentially a stepwise area fill operation.

A "cellular algorithm" is a well known technique, which is used, for example in the Game of Life. In the Game of Life, based on the replication of biological cells, a cell in an infinite quadratic (rectangular) grid can expand (replicate) into any of 8 nearest surrounding cells which are not occupied by another cell. Each grid cell is either alive/on or dead/off. The new state of each cell is computed in discrete timesteps and is determinated by it's old state and the sum of the alive cells among its surrounding 8 nearest neighbours cells. The Game of Life rules let a cell in the next generation live only if a living cell is either surrounded by either 2 or 3 alive cells, the survive condition, or a dead cell flips into the alive state in the next generation if it is surrounded by exactly 3 living cells, the born condition. Otherwise it dies or stays dead. Therefore, a given initial pattern of a collection of alive cells in a universe of dead cells develops according to these rules over the generations and produces various configurations.

"Rasterizing" is the process of converting a vector image into a bitmap image. When you open a vector image in a bitmap-based editing program, you are usually presented with a dialog box of options for rasterizing the image. These options are where you would specify the pixel dimensions and resolution (and color mode, not relevant to the present invention) of the imported file. A vector graphic can also be rasterized by exporting it from a vector-based application to a bitmap format.

Figure 10:
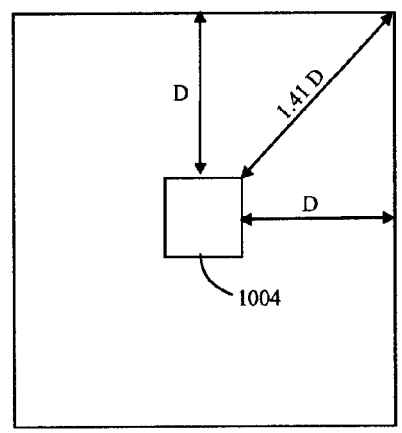
FIG. 10 is a diagram representing a problem inherent in the technique of FIGS. 3-9, according to the prior art.

An advantage of the approach utilized by the present invention is that it is very fast, due to the fact that the main part of the algorithm, the area fill, consists of simple byte examination and modification instructions. It is also more accurate than the prior art approach (e.g., FIGS. 3-9), because the cellular nature of the algorithm provides a simple way to control corner expansion speed (compare FIG. 10). Tests on chip data show a speedup of approximately 100 times (X), and error reduction of approximately 6 times (X) over the prior art.

Figure 11:
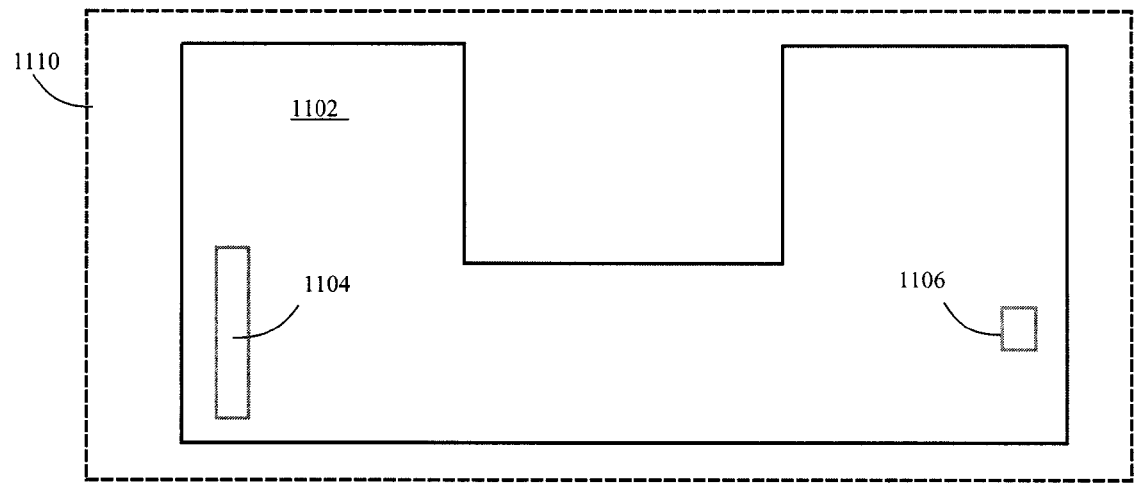

The cellular reachability algorithm of the present invention works as follows:

Step 1) Compute (determine) a combined least enclosing rectangle 1110 (shown in dashed lines) for enclosing a given conductor region shape 1102 (compare 302) and contact shapes 1104, 1106 (compare 304, 306). This is the smallest rectangle that completely encloses all the shapes (conductor, contacts), and is illustrated in FIG. 11. This determines (establishes) the size of a memory array (of cells) for the area of the enclosing rectangle 1110. The enclosing rectangle 1110 may be slightly larger than the conductor region 1102.

Step 2) Create a 2-dimensional byte array of sufficient size to rasterize the enclosing rectangle 1110 computed above at a resolution of "I", the expansion increment value. In this example, the byte array has 16 (horizontal) rows, and each row has 30 cells. The width and height of each cell of the byte array corresponds to the value "I". Initialize each byte (cell) of the byte array to an initial first code (EMPTY code) (e.g." ", shown as a blank cell in the ensuing figures).

Figure 12:
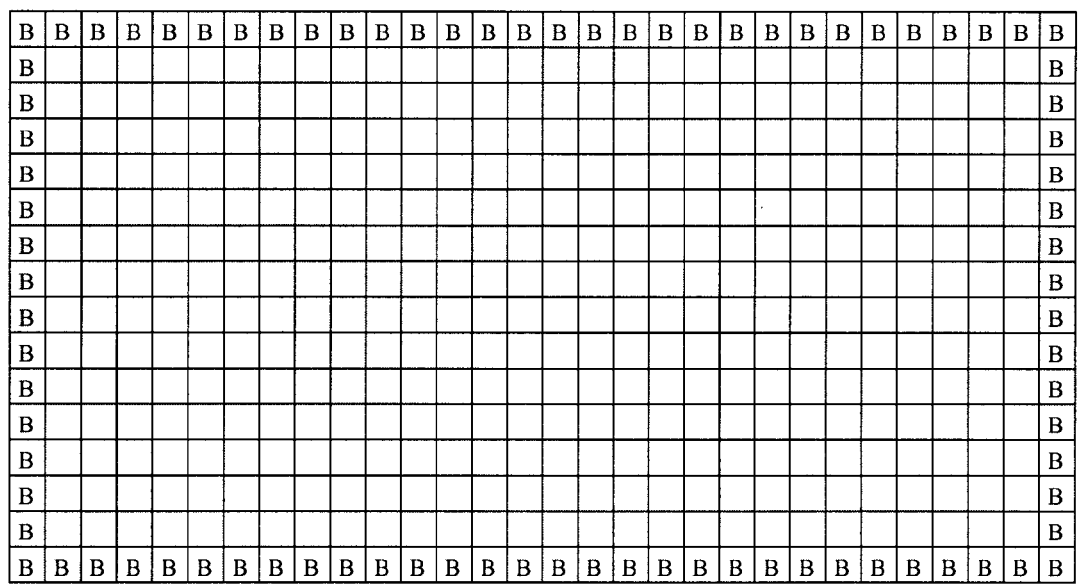

Step 3) Convert (rasterize) the least enclosing rectangle shape 1110 to raster format in the byte array 1200 by inserting a second code (BOUNDARY code) (e.g. "B") into each cell intersected by an edge of the boundary (rectangle) shape, as illustrated in FIG. 12.

Figures 13, 14:
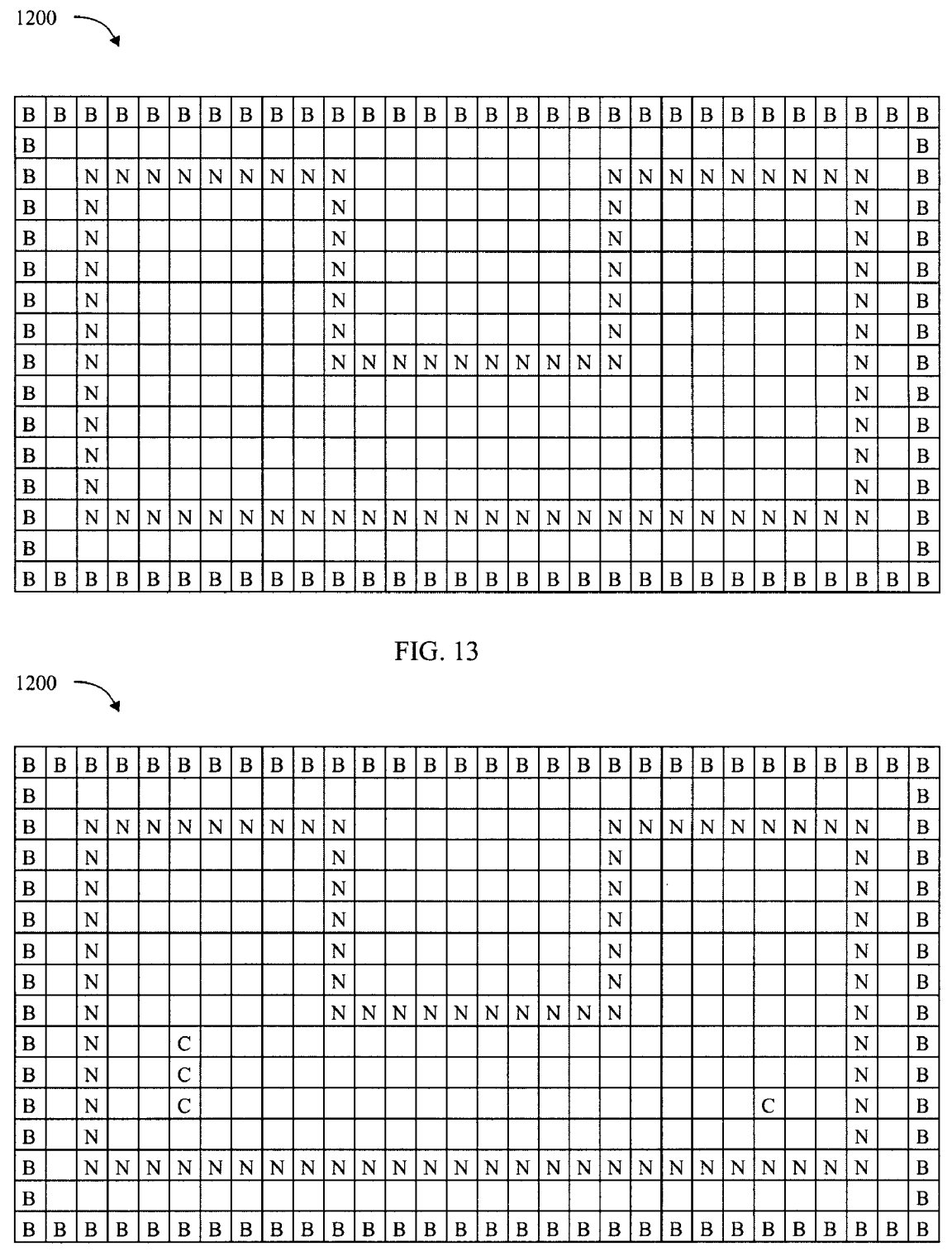

Step 4) Convert (rasterize) the conductor region shape 1102 to raster format in the byte array 1200 by inserting a third code (CONDUCTOR code) (e.g., "N") into each cell intersected by an edge of the conductor region shape, as illustrated in FIG. 13. As shown, only the outline (periphery) of the shape is represented by conductor codes "N". The interior area of the conductor region shape remains empty (filled with EMPTY code " "). The conductor "N" can be right up against the enclosing rectangle "B", although it is shown spaced at least one cell therefrom.

Step 5) Convert (rasterize) the contact shapes 1104, 1106 to raster format in the byte array 1200 by inserting a fourth code (CONTACT code) (e.g. "C") into each cell intersected by an edge of a contact shape, as illustrated in FIG. 14. The contact shape 1104 is 3×1 cells; the contact shape 1106 is only one (1×1) cell. Record the address (location) of each of these cells in a list called the "frontier list". Contact shapes can always be filled. So, if a contact shape were 3×3 cells, all 9 cells could be filled with the CONTACT code "C", although it really doesn't matter if the middle cell were left empty. (Everything inside the contact area is, by definition, "reachable". Also, a junction is not permitted to overlap a contact.)

Step 6) Initialize a variable "D" to establish the maximum distance to be searched. This value is provided, and derives from the electrical characteristics of the semiconductor technology. D=n*I (+R)

Figures 15, 16:
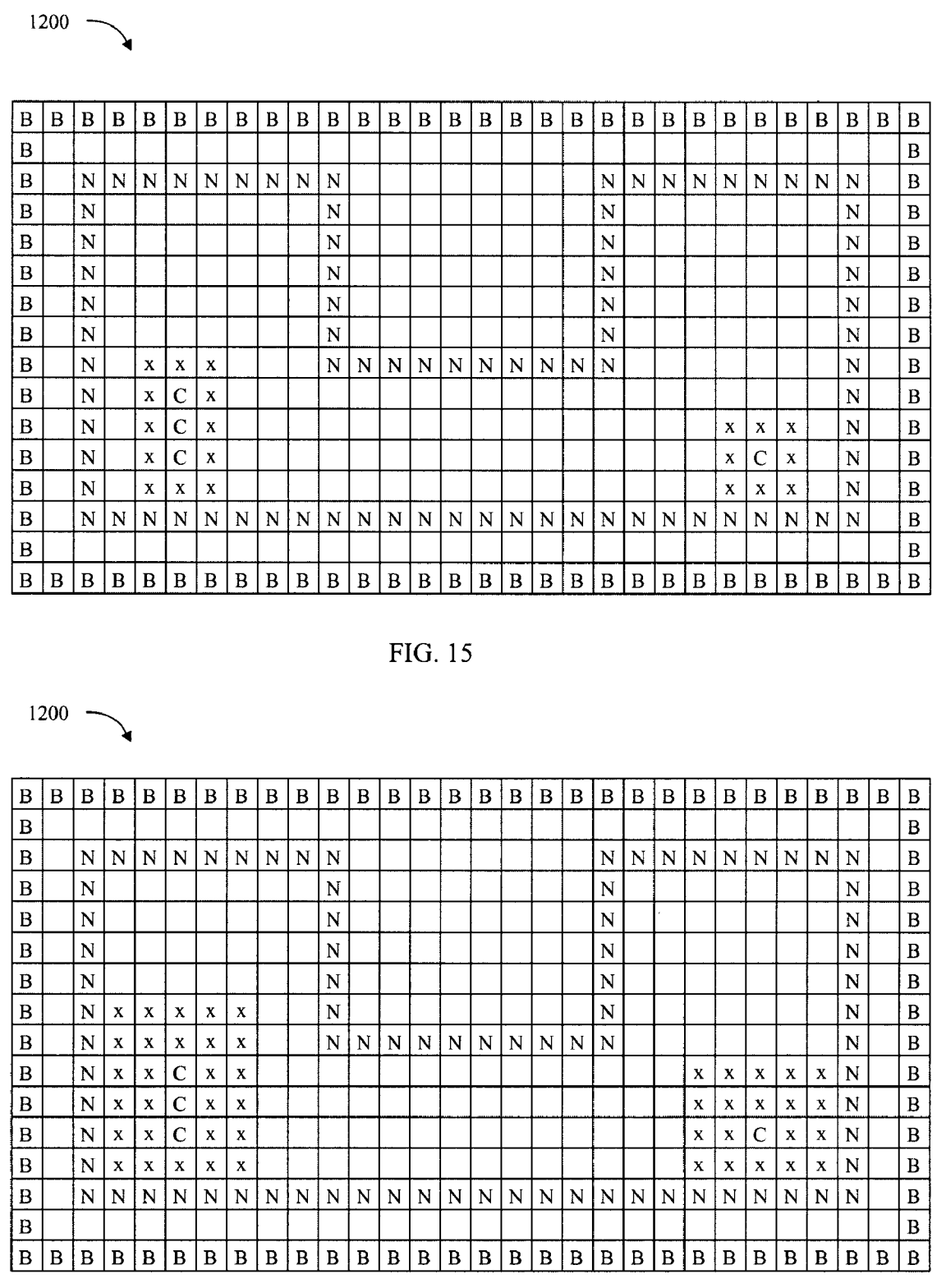

Step 7) Expand the contact shapes by traversing the frontier list one cell at a time, and examining the cell's neighbor cells as to whether they are empty or not. If a neighbor cell is EMPTY (" "), then insert a fifth code (REACHED code) (e.g. "x") into the cell, as illustrated in FIG. 15, and record its location in a new frontier list. If a neighbor cell is not empty, then it is not explored (the contact shape is not expanded into it.) Here it can be seen that the contact shapes 1104 and 1106 have been expanded one increment, in a first iteration of the cellular algorithm.

The new frontier list contains only reachable cells ("x") and in further iterations will be updated. Both the frontier list and the new frontier list are simply lists of memory addresses, or offsets from some point.

Here it can be seen that enlarging a rasterized contact shape (e.g., 1104, 1106) differs greatly from enlarging a vector graphic contact shape (e.g., 304, 306). For example, whereas the enlarged contact shapes 404, 406 needed to be cropped, the expanded contact shapes 1104, 1106 need not be cropped since the contact shape cells are not allowed to expand into a neighboring cell which is not empty (for example into a cell containing a boundary cell "B"). This seemingly subtle nuance can represent a significant savings of computational time.

Step 8) The new frontier list now contains the cells to be expanded in the next iteration of Step 5. If the new frontier list is empty, then the conductor shape 1102 has been completely filled, and there is no unreachable area, so the algorithm terminates. Otherwise, subtract "I" from the "D" variable and check the remainder. If it is zero or less, then the maximum distance has been traversed, and there is (possibly) an unreachable area remaining, so proceed to Step 9. Otherwise, continue performing the cellular algorithm by expanding reached cells into neighboring cells which are empty, and update the new frontier list. FIG. 16 shows results after two expansions. Eventually, all reachable cells will have been marked "x", as illustrated in FIG. 17 (showing results after 6 iterations).

In this example, n=6 expansion steps are shown. It should be recalled that D=n*I (+R). This is merely exemplary. In "real life" situations, typically a few tens, possibly over 100 expansion steps would be performed.

Step 9) Continue expanding by traversing the frontier list one cell at a time, and examining the cell's neighbor cells. If a neighbor cell is EMPTY (" "), then insert a sixth code (UNREACHABLE code) (e.g. "o") into the cell, and record its location in a separate frontier list. This is illustrated by FIG. 18.

Step 10) The separate frontier list now contains the cells to be expanded in the next iteration of "step 9". If the separate frontier list is empty, then the conductor shape has been completely filled—continue at step 11). Otherwise, continue iterations Step 9 until the separate frontier list is empty.

Figure 19:
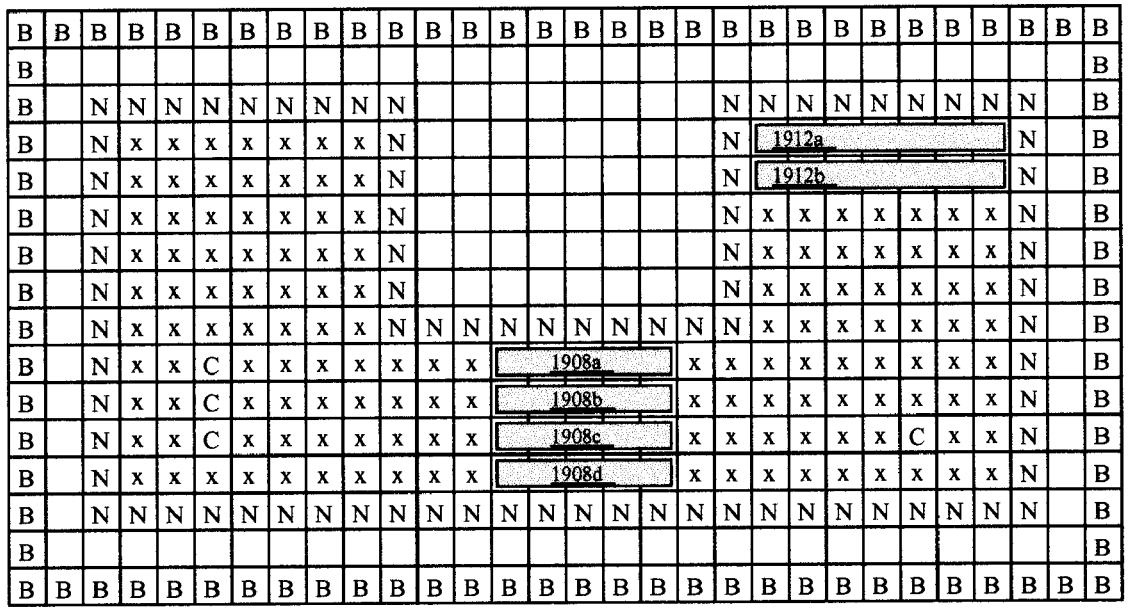

Step 11) Extract the unreachable area by traversing the byte array 1200 row-by-row, detecting horizontal "chains" of UNREACHABLE cells ("o"). Convert each chain into a rectangle shape by converting its corners into (X,Y) coordinate pairs (e.g., lower left, upper right) representing positions in the original drawing space (vector domain). This is shown in FIG. 19. There are four rectangles 1908a, 1908b, 1908c, 1908d (compare 708), and two rectangles 1912a, 1912b (compare 712). Next, compute the union (sum) of these rectangles (1908a, 1908b, 1908c, 1908d and 1912a, 1912b), and return these shape(s) as the unreachable areas 2008 and 2012 (compare 708, 712). This is shown in FIG. 20.

Alternatively, rather than multiple small rectangles (1908a, 1908b, 1908c, 1908d and 1912a,1912b), each UNREACHABLE cell "o" could be converted to a square, then unionized. The UNREACHABLE cells shown in FIG. 19 are conveniently converted to rectangles because of the nature of the byte array, which is that several of the UNREACHABLE cells are in the same row, in adjacent memory locations.

Figure 20:
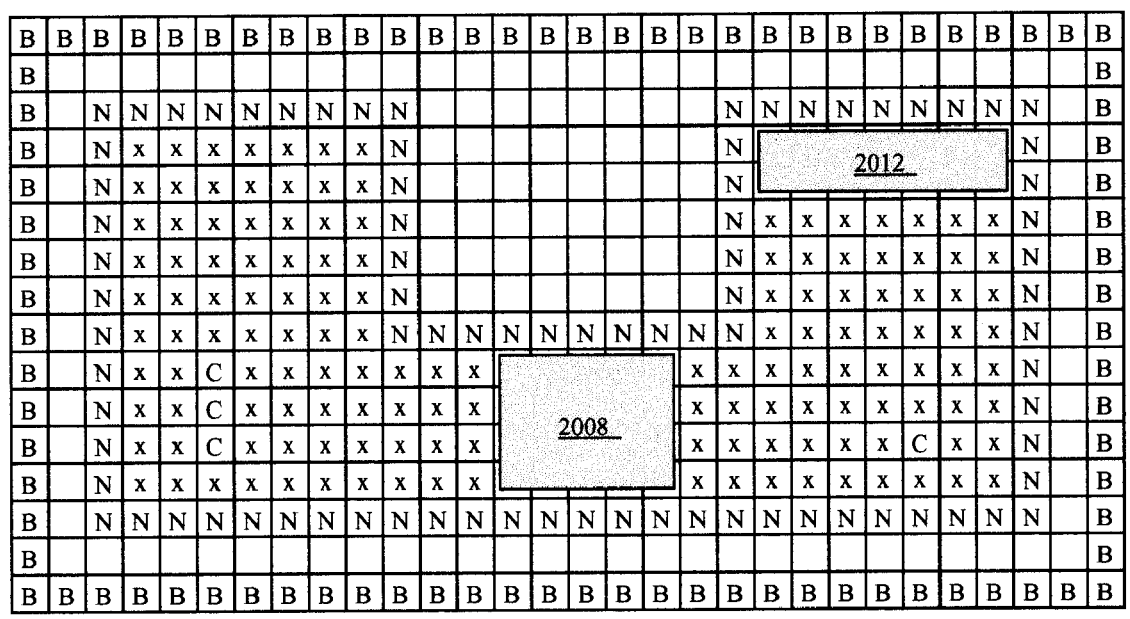

What is happening in FIGS. 19 and 20 is that the rectangles are being converted back to the vector domain for use by traditional vector-based design tools.

As described above with respect to the prior art (FIG. 9), the shapes representing the unreachable area of the conductor region (if any) are then checked against junction shapes in the design, and any junction shapes which intersect the unreachable area are flagged (reported to the designer) as erroneous (errors). The designer can then take corrective measures, such as adding contacts which are closer to the junction shapes.

Normally, the expansion process in the cellular algorithm involves looking in each of eight neighboring cells that a cell can expand to. A refinement to the process described above is to save an additional "direction" value at each cell location for a contact shape. This value indicates which of eight possible directions of expansion that a given cell can expand in. These values can be represented as "north, "northeast", "east", "southeast", "south", "southwest", "west", or "northwest". During the iterative expansion phase, each cell only needs to examine the cell in the direction indicated by its "direction" value along with the two cells on either side of that direction. For example, a cell with a direction value of "north" would only have to examine the cells to the north, northwest, and northeast of its position. This method of restricting the directions in which a cell can expand reduces the total number of cell "read" operations from 8T to 3T, where "T" is the total number of cells within the conductor shape.

Another refinement to the process described above addresses the inaccuracy introduced at the corners of the expanding contact shapes, which was discussed above with respect to FIG. 10. If the cellular process expands corner cells as described above, the actual distance implied by an expansion value of "I" at a corner will be the square root of two (1.41) times "I". This represents an error of approximately 41% at the corners. By skipping the corner cells on every fourth iteration of the cell expansion process, the corners will move forward at a rate equal to $(3/4)(sqrt(2))*I$, or approximately 1.06*I, which results in a maximum corner error of only approximately 6%. This periodic skipping of corner cells does not significantly affect performance.

Figure 21:
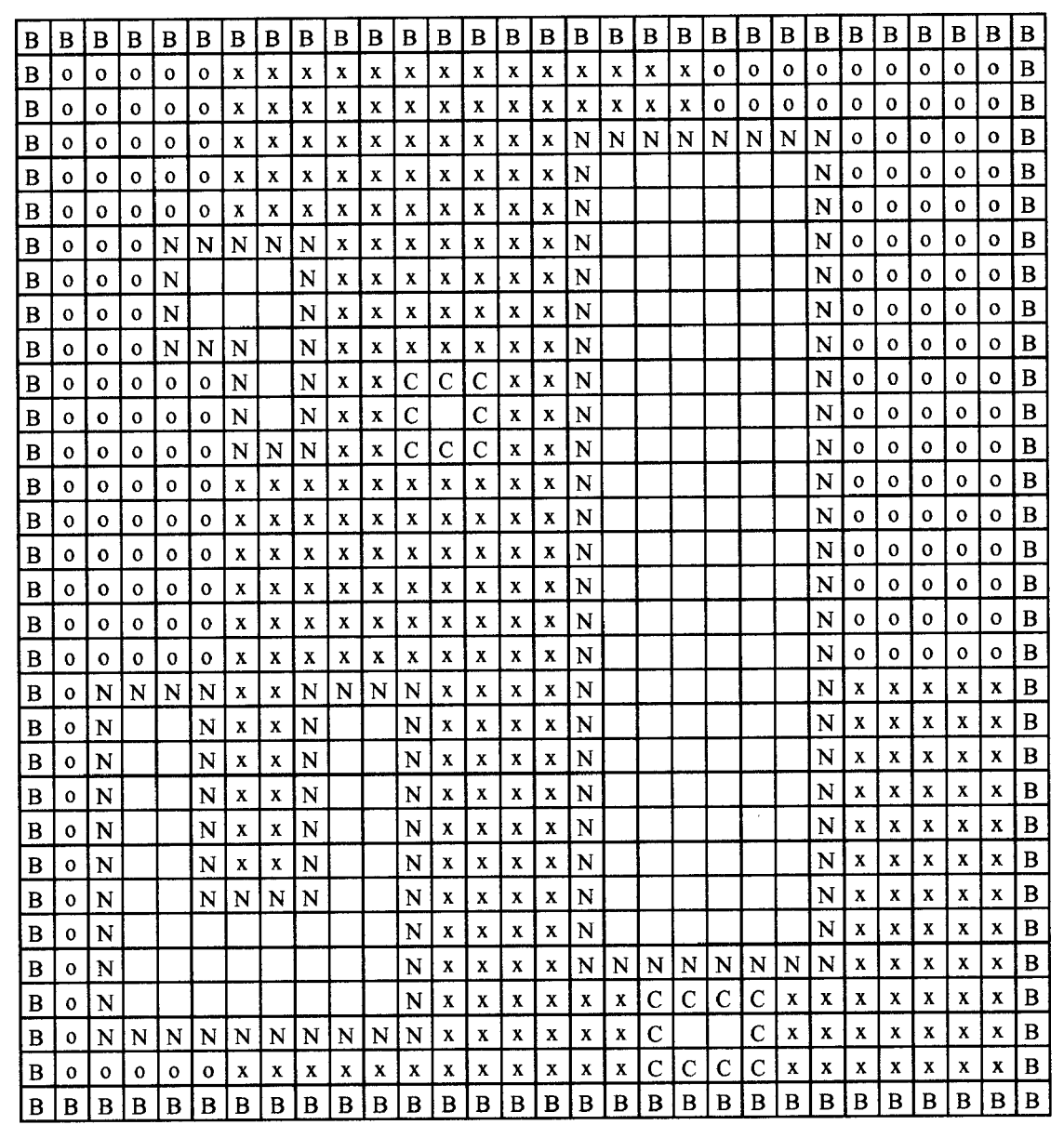

A variation of the process is illustrated in FIG. 21 and can be applied to determine reachability outside (without), as opposed to inside (within), a set of conductor shapes. In this case, three separate conductive region shapes are represented (in outline) by cells filled with CONDUCTOR code "N", and the least enclosing rectangle, represented by cells filled with BOUNDARY code "B", is enlarged to allow at least one cell between the boundary cells "B" and any conductor cells "N". Two contacts are shown, represented by cells filled with CONTACT code "C". The process proceeds as previously described, with the conductor region shapes "N" now representing "holes" which are automatically avoided in the contact expansion process. The contact cells expand around the conductor region shapes instead of within them. Unreachable cells are represented by cells filled with UNREACHABLE code "o". FIG. 21 is intended to be illustrative, not a rigorous, accurate representation.

The reason for allowing at least one cell between the boundary cells "B" and any conductor cells "N" when exploring outside the conductor regions is to allow for exploration of cells which otherwise may not be accessible, such as if an hourglass shaped conductor region were butted up against the enclosing rectangle, creating a pinch point. This condition of allowing at least one cell between the boundary cells "B" and any conductor cells "N" was not required when exploring inside the conductor regions.

Figure 1:
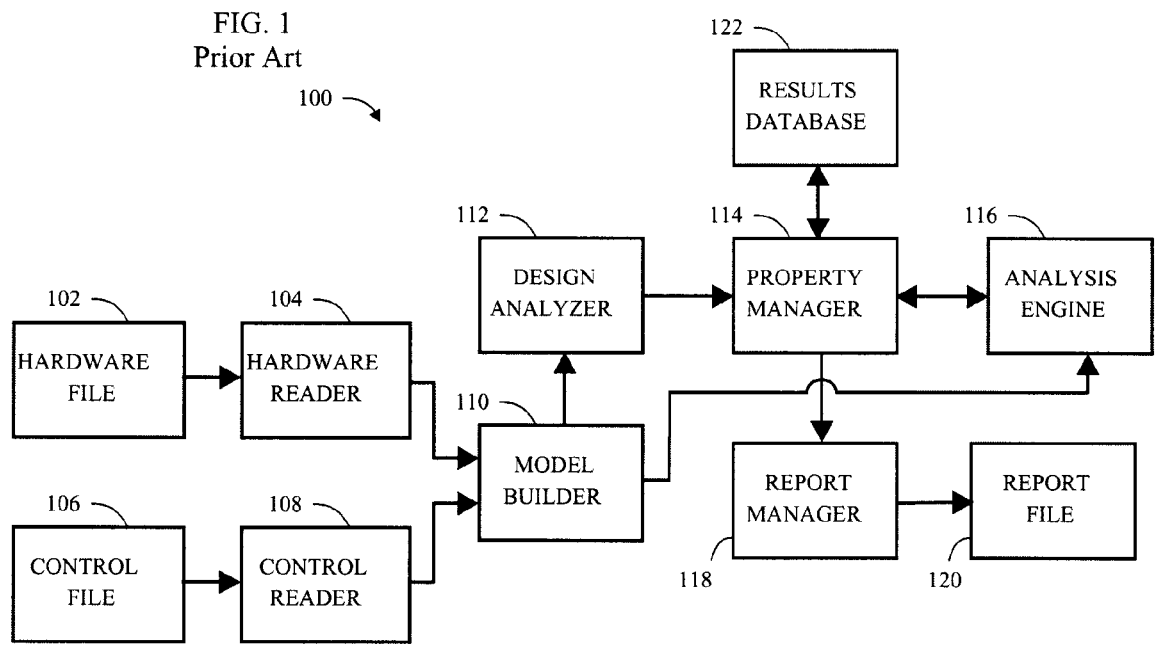
FIG. 1 is a diagram of a system for performing design verification, and is exemplary of the prior art.
Figure 2A:
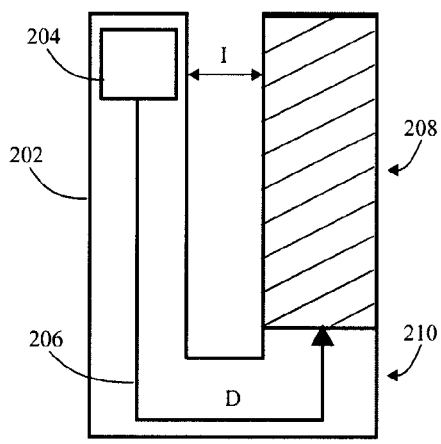
FIGS. 2A and 2B are diagrams of a contact disposed within a conductor region, and are exemplary of the prior art.
Figure 2B:
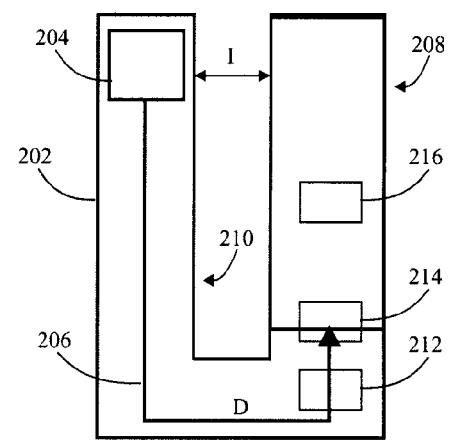
Figure 3:
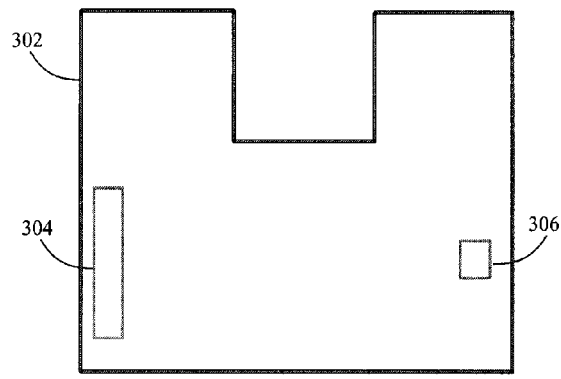
FIGS. 3-9 are diagrams of a technique for performing latch up check, according to the prior art.
Figure 4:
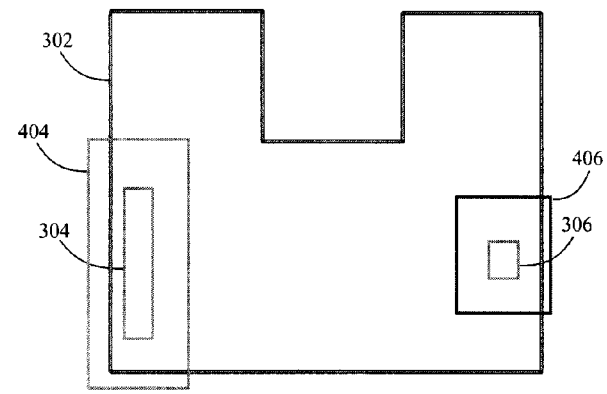
Figure 5:
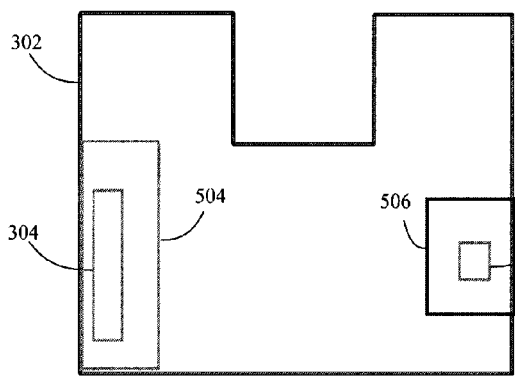
Figure 6:
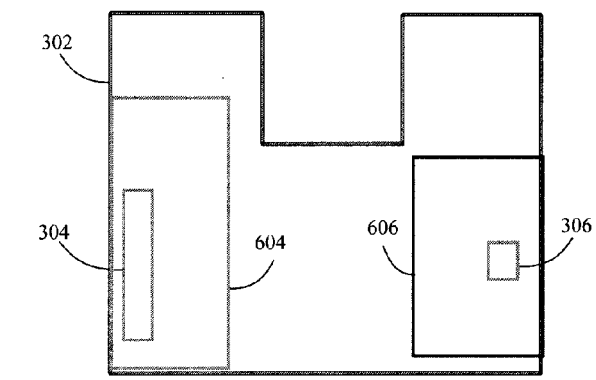
Figure 7:
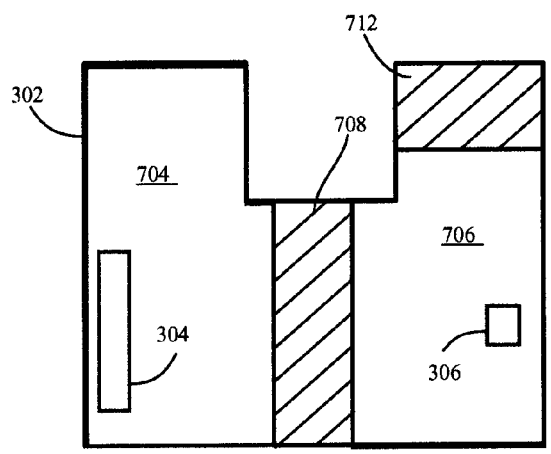
Figure 8:
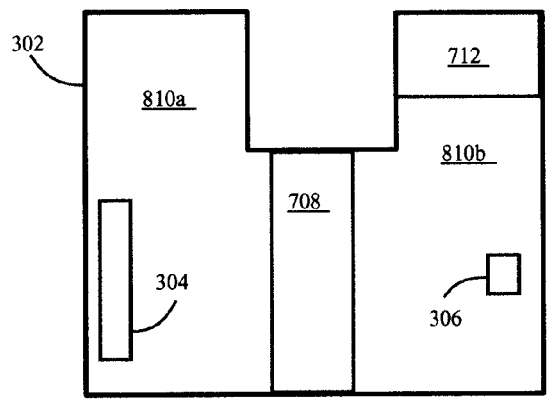
Figure 9:
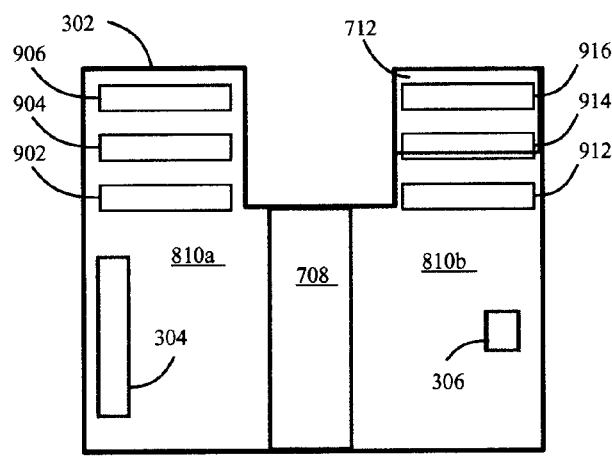

The invention, as described above, can be implemented in an IC design system, such as the system 100 shown in FIG. 1. For example, the design rules (reachability, and the parameters associated therewith, for avoiding latch up) may be included in a file associated with the hardware design representation 102, such as the control file 106. The control file is a computer-readable medium. The design rules could be stored in a computer-readable medium other than the control file 106. The steps of the cellular algorithm, and variations described hereinabove may be stored as steps in a software program on any computer-readable medium and the program controls the operation of the design analyzer 112, the property manger 114 and the analysis engine 116. Reports, such as the frontier lists, erroneous junctions, can be generated by the report manager 118.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after conversion to another language, code or notation and/or reproduction in a different material form.

The computer program product can be embodied in any computer-readable medium (such as floppy disc, CD ROM, DVD ROM, hard disc, etc.) which is accessible either directly (e.g., locally) or indirectly (over a remote communications link, such as an intranet or the Internet) to the computer of the system.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A method of performing latch up check on an integrated circuit (IC) design comprising the steps of:
   computing a rectangular shape that encloses a conductor region shape and contact shapes on the integrated circuit design, said rectangle shape being the smallest rectangular shape that completely encloses the conductor region shape and the contact shapes;
   rasterizing the conductor region shape and the contact shapes;
   iteratively expanding the contact shapes within the conductor region shape using a cellular algorithm;
   generating shapes representing an unreachable area of the conductor region shape;
   checking the shapes representing the unreachable area of the conductor region shape against junction shapes in the integrated circuit design, and reporting to a designer any junction shapes which intersect the unreachable area as errors;
   representing the contact shapes as cells in a byte array;
   exploring the conductor region shape by expanding the conductor region shape into neighboring cells of the byte array; and
   periodically skipping expanding corner cells of the contact shapes.

2. The method, according to claim 1, further including the step of restricting the number of directions in which the cells can expand.

3. The method, according to claim 1, further including the step of creating a 2-dimensional byte array of sufficient size to rasterize the enclosing rectangle at a resolution of "I", wherein the width and height of each cell in the array corresponds to the value "I".

4. The method, according to claim 3, further including the step of initializing each cell of the byte array to a first code representing an empty cell.

5. The method, according to claim 4, further including the step of converting the least enclosing rectangle to raster format in the byte array by inserting a second code into each cell intersected by an edge of the rectangle shape.

6. The method, according to claim 5, further comprising the step of converting the conductor region shape to raster format in the byte array by inserting a third code into each cell intersected by an edge of the conductor region shape.

7. The method, according to claim 6, further comprising the steps of:
   converting the contact shapes to raster format in the byte array by inserting a fourth code into each cell intersected by an edge of a contact shape; and
   recording the address of each of these cells in a frontier list.

8. The method, according to claim 7, further comprising the step of establishing a maximum distance to be searched.

9. The method, according to claim 8, further comprising the steps of:
   expanding the contact shapes by traversing the frontier list one cell at a time and examining the cell's neighbor cells as to whether they are empty or not;
   inserting a fifth code into the neighbor cell and recording its location in a new frontier list if a neighbor cell is empty; and
   not expanding into it if a neighbor cell is not empty.

10. The method, according to claim 9, further comprising the steps of:
    expanding cells which are recorded in the new frontier list; and
    inserting a fifth code into the neighbor cell and recording its location in the new frontier list if a neighbor cell is empty; and
    not expanding into it if a neighbor cell is not empty.

11. The method, according to claim 10, further comprising the steps of:
    continuing to expand cells by traversing the new frontier list one cell at a time, and examining the cell's neighbor cells; and
    inserting a sixth code into the cell, and record its location in a third frontier list if a neighbor cell is empty.

12. A method of performing latch up check on an integrated circuit (IC) design comprising the steps of:
    computing a rectangular shape that encloses a conductor region shape and contact shapes on the integrated circuit design, said rectangle shape being the smallest rectangular shape that completely encloses the conductor region shape and the contact shapes;
    rasterizing the conductor region shape and the contact shapes;
    iteratively expanding the contact shapes within the conductor region shape using a cellular algorithm;
    generating shapes representing an unreachable area of the conductor region shape; and
    checking the shapes representing the unreachable area of the conductor region shape against junction shapes in the design, and reporting to a designer any junction shapes which intersect the unreachable area as errors;
    creating a 2-dimensional byte array of sufficient size to rasterize the enclosing rectangle at a resolution of "I", wherein the width and height of each cell in the array corresponds to the value "I";
    initializing each cell of the byte array to a first code representing an empty cell;
    converting the least enclosing rectangle to raster format in the byte array by inserting a second code into each cell intersected by an edge of the rectangle shape;
    converting the conductor region shape to raster format in the byte array by inserting a third code into each cell intersected by an edge of the conductor region shape;
    converting the contact shapes to raster format in the byte array by inserting a fourth code into each cell intersected by an edge of a contact shape;
    recording the address of each of these cells in a frontier list;
    establishing a maximum distance to be searched;
    expanding the contact shapes by traversing the frontier list one cell at a time and examining the cell's neighbor cells as to whether they are empty or not;
    inserting a fifth code into the neighbor cell and recording its location in a new frontier list if a neighbor cell is empty and not expanding into it if a neighbor cell is not empty;
    expanding cells which are recorded in the new frontier list;
    inserting a fifth code into the neighbor cell and recording its location in the new frontier list if a neighbor cell is empty and not expanding into it if a neighbor cell is not empty;

continuing to expand cells by traversing the new frontier list one cell at a time, and examining the cell's neighbor cells; and inserting a sixth code into the cell, and record its location in a third frontier list if a neighbor cell is empty; and further comprising the step of extracting an unreachable area of the conductor region by traversing the byte array, row-by-row, detecting horizontal chains of unreachable cells, converting each chain into a rectangle by converting its corners into (X,Y) coordinate pairs representing positions in an original drawing space, and computing the union of these rectangles, and returning these shape(s) as the unreachable area of the conductor region.

13. The method, according to claim 12, further comprising the steps of:

extracting an unreachable area of the contact region by converting each unreachable cell in the byte array to a square;

unionizing all the unreachable cells; and returning these shape(s) as the unreachable area of the conductor region.

14. A method of performing latch up check on an integrated circuit (IC) design comprising the steps of:

rasterizing vector domain images of a conductor legion shape and well contact shapes;

iteratively expanding the well contact shapes using a cellular algorithm;

extracting unreachable areas of the conductor region shape by detecting chains of unreachable cells;

converting unreachable areas into shapes, and returning these shapes as unreachable areas in the vector domain;

checking the unreachable areas against junction shapes in the design; and flagging any junction shapes which intersect the unreachable areas as errors.

15. A computer program product comprising:

a computer usable medium having computer readable program code means embodied therein for performing latch up check on an integrated circuit (IC) design;

computer readable program code means for causing a computer to rasterize vector domain images of a conductor region shape and well contact shapes;

computer readable program code means for causing the computer to iteratively expand the contact shapes using a cellular algorithm;

computer readable program code means for causing the computer to extract unreachable areas of the conductor region shape by detecting chains of unreachable cells;

computer readable program code means for causing the computer to convert unreachable areas into shapes, and returning these shapes as unreachable areas in the vector domain; and computer readable program code means for causing the computer to check the unreachable areas in the vector domain against junction shapes in the design, and to flag any junction shapes which intersect the unreachable areas as errors.

16. The computer program product, according to claim 15, further comprising:

computer readable program code means for causing the computer to represent the contact shapes as cells in a byte array; and computer readable program code means for causing the computer to explore the conductor region shape by expanding into neighboring cells of the byte array.

17. The computer program product, according to claim 16, further comprising computer readable program code means for causing the computer to periodically skip expanding corner cells of the contact shapes.

18. The computer program product, according to claim 16, further comprising computer readable program code means for causing the computer to restrict the number of directions in which a cell in the byte array can expand.

19. A method of performing latch up check on an integrated circuit (IC) design comprising the steps of:

computing a rectangular shape that encloses a conductor region shape and contact shapes on the integrated circuit design, said rectangle shape being the smallest rectangular shape that completely encloses the conductor region shape and the contact shapes;

representing the contact shapes as cells in a byte array;

rasterizing the conductor region shape and the contact shapes;

iteratively expanding the contact shapes within the conductor region shape using a cellular algorithm;

generating shapes representing an unreachable area of the conductor region shape;

checking the shapes representing the unreachable area of the conductor region shape against junction shapes in the design, and reporting to a designer any junction shapes which intersect the unreachable area as errors; and extracting an unreachable area of the conductor region shape by traversing the byte array, row-by-row, detecting horizontal chains of unreachable cells, converting each chain into a rectangle by converting its corners into (X,Y) coordinate pairs representing positions in an original drawing space, and computing the union of these rectangles, and returning these shape(s) as the unreachable area of the conductor region.

* * * * *